United States Patent
Chandwani et al.

(10) Patent No.: US 8,792,267 B1
(45) Date of Patent: Jul. 29, 2014

(54) MEMORY HAVING SENSE AMPLIFIER FOR OUTPUT TRACKING BY CONTROLLED FEEDBACK LATCH

(71) Applicant: LSI Coporation, Milpitas, CA (US)

(72) Inventors: Kamal Chandwani, Karnataka (IN); Rahul Sahu, Karnataka (IN); Vikash, Karnataka (IN)

(73) Assignee: LSI Corporation, Milpitas, CA (US)

( * ) Notice: Subject to any disclaimer, the term of this patent is extended or adjusted under 35 U.S.C. 154(b) by 33 days.

(21) Appl. No.: 13/747,814

(22) Filed: Jan. 23, 2013

(51) Int. Cl.
G11C 11/00 (2006.01)
G11C 11/412 (2006.01)
G11C 7/06 (2006.01)

(52) U.S. Cl.
CPC ............... G11C 11/412 (2013.01); G11C 7/06 (2013.01)
USPC .... 365/154; 365/205; 365/230.03; 365/233.1

(58) Field of Classification Search
CPC ................................. G11C 11/412; G11C 7/06
USPC .......................... 365/154, 205, 230.03, 233.1
See application file for complete search history.

(56) References Cited

U.S. PATENT DOCUMENTS

| 6,734,709 | B1 | 5/2004 | Zhu et al. | |
|---|---|---|---|---|
| 7,359,281 | B2 | 4/2008 | Soares et al. | |
| 2003/0231527 | A1* | 12/2003 | Nakase et al. | 365/196 |
| 2004/0042275 | A1* | 3/2004 | Yoshizawa et al. | 365/189.07 |

* cited by examiner

*Primary Examiner* — Hoai V Ho

(57) ABSTRACT

In described embodiments, a memory circuit includes a static random access memory (SRAM) including N banks of memory cells, rows of M sense amplifiers, a controlled feedback latch storing a previous state of input data in a read cycle, a pull down select block coupled to the controlled feedback latch and the dummy sense amplifier, a dummy output latch coupled to the pull-down select block to store the read data, and a SRAM reset generation circuit coupled to the sense amplifier control circuits and the controlled feedback latch. The dummy output latch is a latch that is the same as a sense amplifier latch used in the local input/output circuit, thereby, no margin is involved between a reset of the sense amplifiers and the read data latched at the dummy output latch in the read cycle.

16 Claims, 7 Drawing Sheets

118

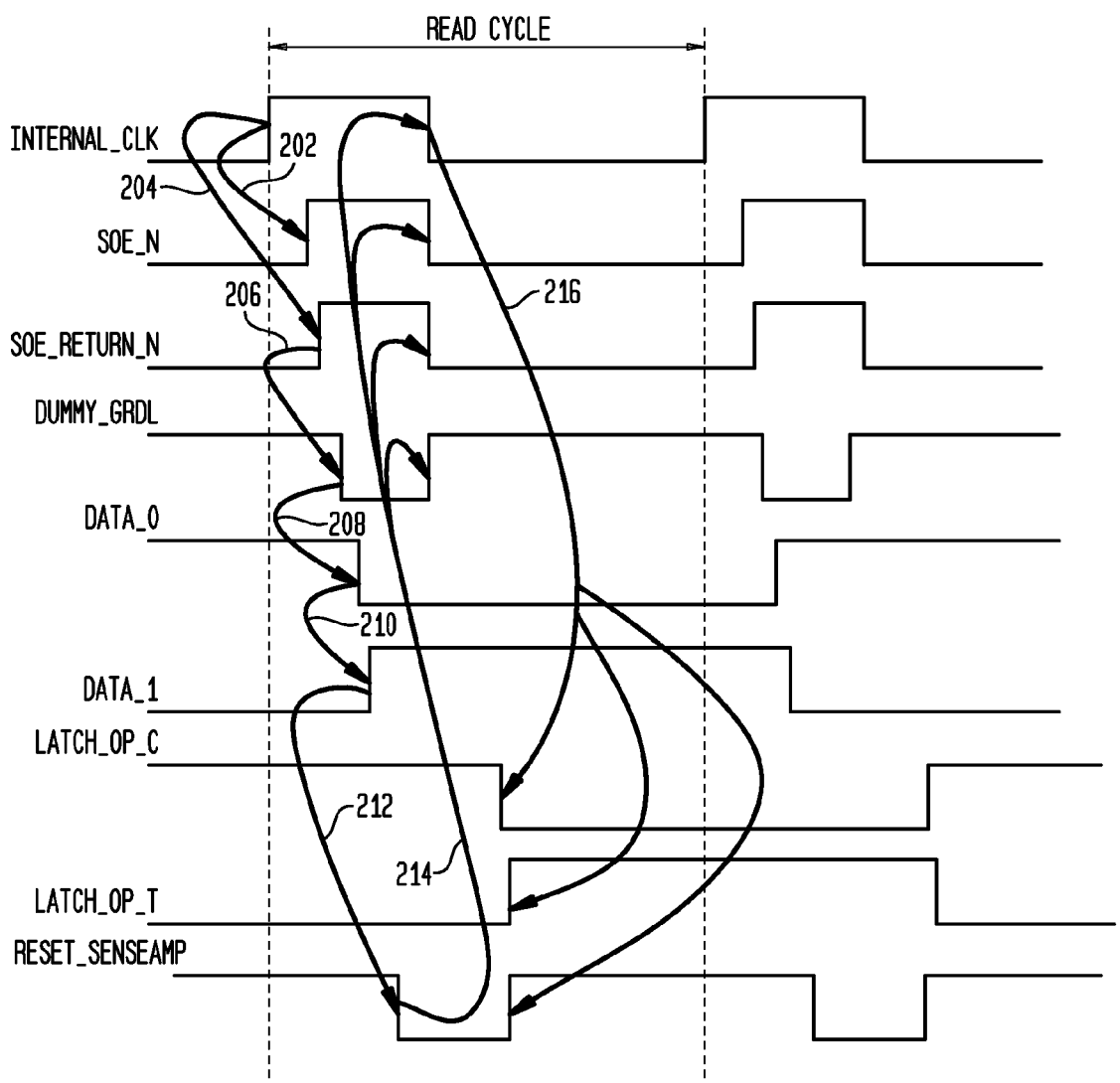

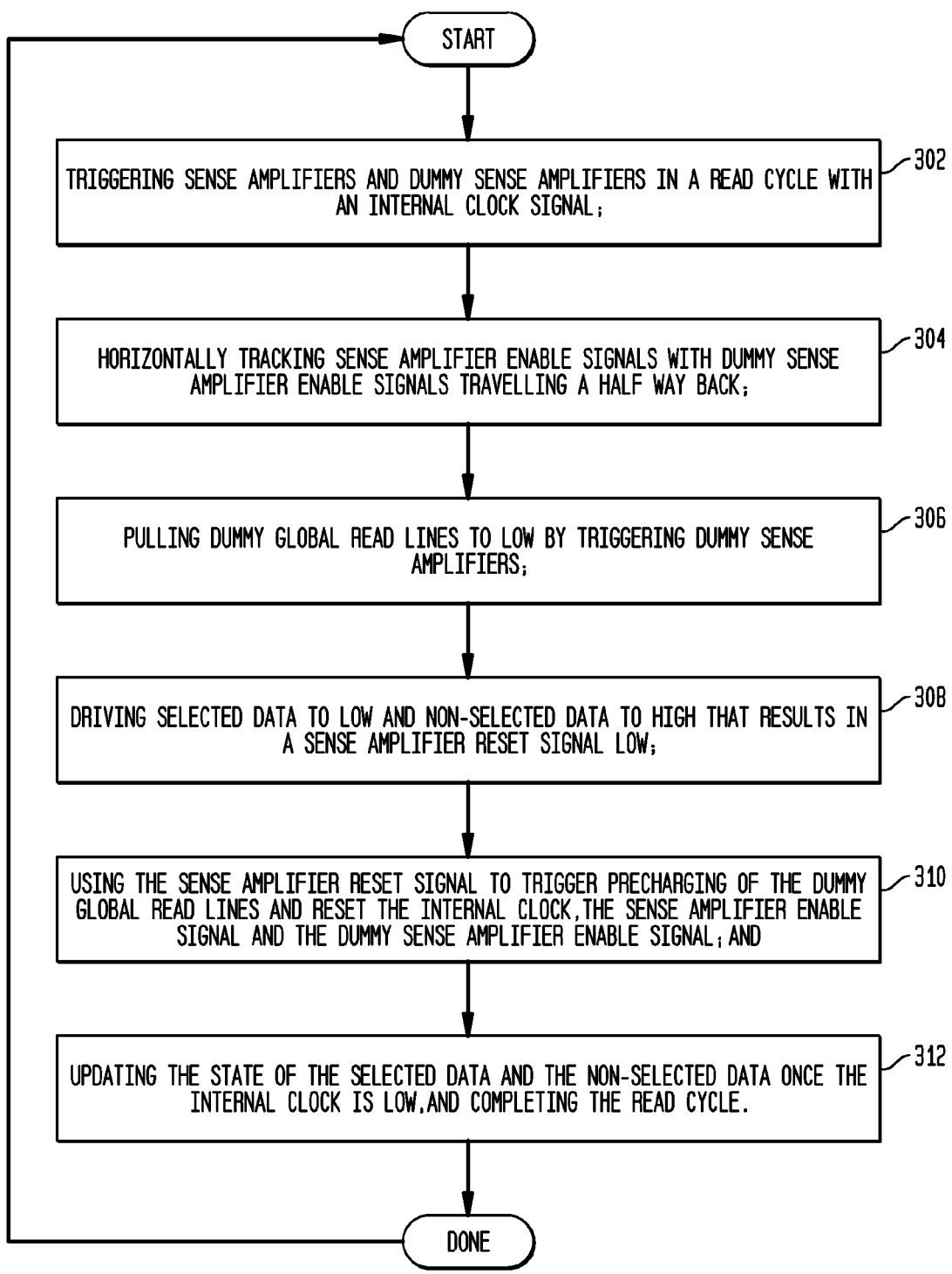

MEMORY HAVING SENSE AMPLIFIER FOR OUTPUT TRACKING BY CONTROLLED FEEDBACK LATCH

BACKGROUND

In semiconductor integrated circuits (ICs) and, in particular, in static random access memories (SRAMs), data stored in a memory cell is read via a bit line pair and an input/output line pair. During a read operation, since a voltage difference across a bitline pair and a voltage difference across an input/output line pair are very small, a sense amplifier is used to sense small the differences in voltages.

In high-speed applications, sense amplifier based SRAMs require the sense amplifier have a reset capability. The resetting of the sense amplifier should happen with the 100% assurance of successful reading of sense data. Conventionally, it is maintained with the margin simulations across the functional process, voltage and temperatures (PVT) corners and margin PVT corners. Because there is no tracking of output data latched in an output latch, the conventional methods consume more time and subsequently, penalize a read/write cycle time, which results in a limitation in improving operation speed of a processor.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a memory circuit including a static random access memory (SRAM) including N banks of memory cells, each bank having M columns of the SRAM, where M and N are positive integers, rows of M sense amplifiers, each row of the M sense amplifiers placed between two banks of the memory cells and having a sense amplifier control circuit and a local input/output circuit wherein each sense amplifier control circuit includes a dummy sense amplifier that imitates the behavior of the M sense amplifiers, a controlled feedback latch storing a previous state of input data in a read cycle, a pull down select block coupled to the controlled feedback latch and the dummy sense amplifier, wherein the pull down select block pulls dummy global read lines of the dummy sense amplifier to LOW, outputs read data depending on the state of outputs of the controlled feedback latch, a dummy output latch coupled to the pull-down select block to store the read data, and a SRAM reset generation circuit coupled to the sense amplifier control circuits and the controlled feedback latch, the SRAM reset generation circuit selecting the input data that is HIGH for the controlled feedback latch and generating a sense amplifier reset signal to reset the sense amplifier control circuits.

The dummy output latch is a latch that is the same as a sense amplifier latch used in the local input/output circuit, thereby, no margin is involved between a reset of the sense amplifiers and the read data latched at the dummy output latch in the read cycle.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

FIG. 6 shows an exemplary timing diagram of the sense amplifier for output tracking shown in FIG. 1; and FIG. 7 shows a flowchart showing a method for a sense amplifier for output tracking in accordance with exemplary embodiments.

DETAILED DESCRIPTION

Described embodiments relate to configuration of a memory with a sense amplifier for output tracking by a controlled feedback latch. The sense amplifier for output tracking tracks reading of data and assures a resetting of the sense amplifier after a successful latching of the read data in an output latch. Thus, a restoring of a state of the sense amplifier to output latch is eliminated, which offers a significant gain in a cycle time. A method of the sense amplifier for output tracking in the described embodiments mimics exact latching as it is at the output of the sense amplifier and provides a margin free sense amplifier for output tracking. The method resets the sense amplifier with a proper tracking of output data read across process, voltage and temperature (PVT) variations.

The following detailed description utilizes a number of acronyms, which are generally well known in the art. While definitions are typically provided with the first instance of each acronym, for convenience, Table 1 provides a list of the acronyms and abbreviations used along with their respective definitions.

TABLE I

| | |
|---|---|
| CFL | Controlled Feedback Latch |
| PSB | Pull-down Select Block |
| DOL | Dummy Output Latch |
| SRG | Sense-Amplifier Reset Generator |
| GIO | Global Input-Output |
| SMPCTRL | Sense-amplifier Control |
| SOEG | Sense-amplifier to Output Enable Generator |
| DMY_SA | Dummy Sense amplifier |
| SAPRCH | Sense-amplifier Pre-charge Block |
| SA | Sense Amplifier |
| GRDT | Global read true |
| GRDC | Global read complement |

Hereinafter, exemplary embodiments are described with reference to the drawings.

Figure 1:
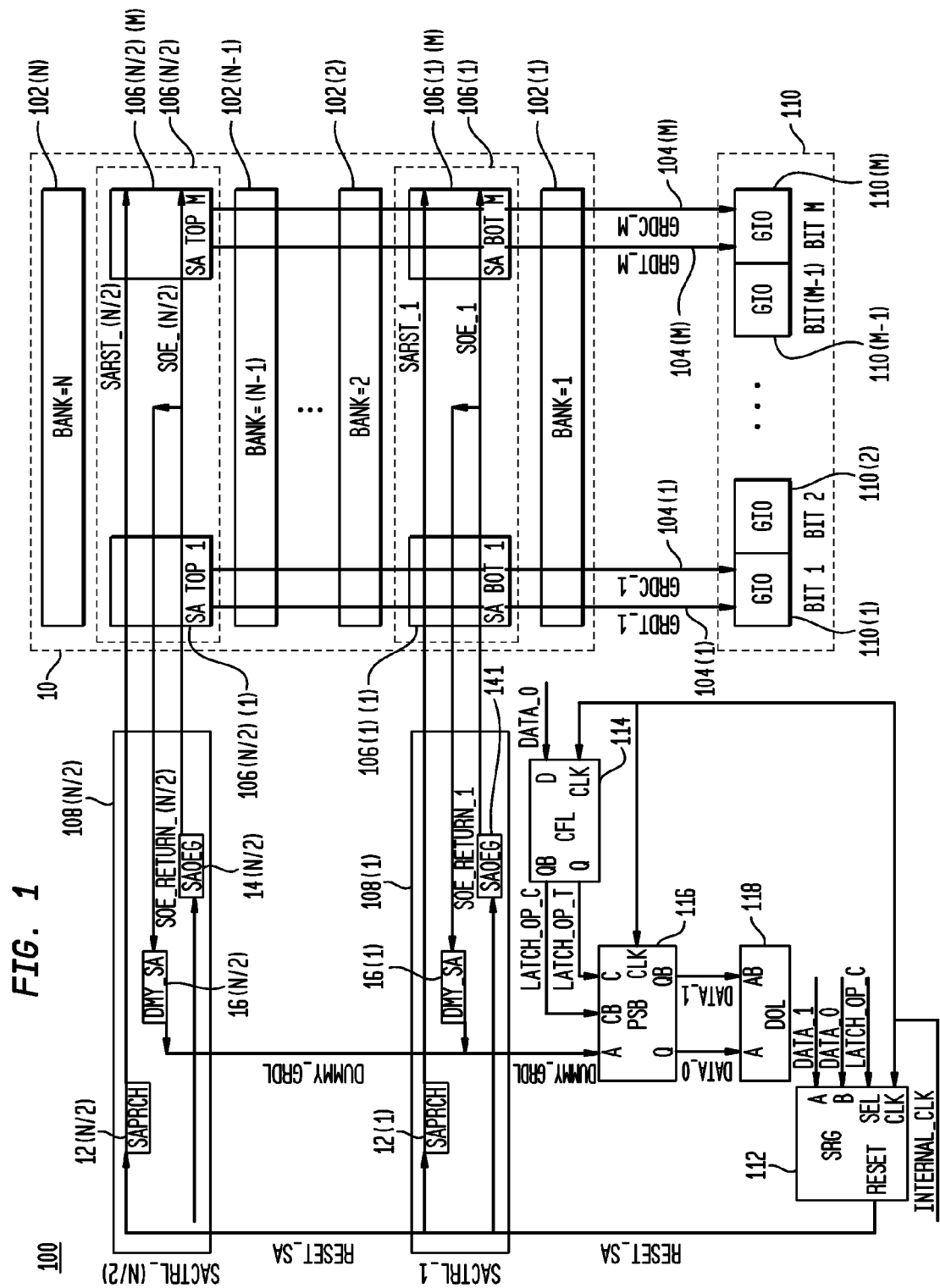
FIG. 1 shows a schematic view of a SRAM system with a sense amplifier for output tracking in accordance with exemplary embodiments.

FIG. 1 is a schematic view of a SRAM system with a sense amplifier to output tracking in accordance with exemplary embodiments. As shown, SRAM system 100 refers to a general case of N banks and M bits of a SRAM, in which a local input/output (IO) is shared between two banks. Herein a bank refers to an array of core-cells of the SRAM, and N and M are positive integers.

As shown in FIG. 1, SRAM system 100 includes SRAM 10 having banks 102(1), 102(2), . . . 102(N−1) and 102(N) and bits 104(1), 104(2), 104(M−1) and 104(M), sense amplifier (SA) rows 106(1), . . . , 106(N/2), sense amplifier control (SACTRL) circuits 108(1), . . . 108(N/2), global inputs and outputs (GIO) block 110, sense-amplifier reset generator (SRG) 112, controlled feedback latch (CFL) 114, pull-down select block (PSB) 116, and dummy output latch (DOL) 118.

Banks 102(1), 102(2), . . . 102(N−1) and 102(N) each are an array of core-cells of SRAM 10. N banks of SRAM 10 each have M bits 104(1), 104(2), 104(M−1) and 104(M). M bits 104(1), 104(2), 104(M−1) and 104(M) each have two global bitlines. The two global bitlines are GRDT and GRDC, respectively. For example, bit 104(1) has global read lines GRDT_1 and GRDC_1; . . . ; bit 104(M) has global read lines GRDT_M and GRDC_M.

SA rows 106(1), . . . , 106(N/2) are each placed between two banks and coupled to a local input/output (IO) circuit (not shown) shared between the two banks. For example, SA row 106(11) is placed between banks 102(1) and 102(2) and coupled to the local IO that is shared between banks 102(1) and 102(2); SA row 106(2) is placed between banks 102(3) and 102(4) and coupled to the local IO that is shared between banks 102(3) and 102(4) (not shown). SA row 106(N/2) is placed between bank 102(N−1) and bank 102(N) and coupled to the local IO that is shared between banks 102(N−1) and 102(N). SA rows 106(1), . . . , 106(N/2) each have M sense amplifiers corresponding to the M bits. For example, SA row 106(1) includes SA 106(1)(1), . . . SA 106(1)(M); SA row 106(N/2) include SA 106(N/2)(1), . . . SA (N/2)(M). SA rows 106(1), . . . 106(N/2) form an array of the SAs. Each column of the array of the SAs corresponds to a column of bits in each bank of the core cells. Each column of the SAs is connected together and coupled to the corresponding GIO of the corresponding bit. For example, SA 106(N/2)(M) is connected to SA 106(1)(M) and then coupled to GIO 110(M); . . . SA 106(N/2)(1) is connected to SA 106(1)(1) and then coupled to GIO 110(1). Thus, each SA is coupled to the corresponding global read lines (GRDLs) (i.e., GRDT and GRDC). SAs 106(1)(1), . . . 106(1)(M), . . . 106(N/2)(1), . . . 106(N/2)(M) might be implemented as any existing and prospective sense amplifier known in the art.

Each SA row has a sense amplifier control (SACTRL) circuit that provides sense amplifier enable signals (SOE_N) and controls the each SA row. For example, SACTRL_1 108(1) controls SA row 106(1), . . . , and SMPCTRL_(N/2) 108(N/2) controls SA row 106(N/2). Each SACTRL circuit includes a sense amplifier precharge (SAPRCH) circuit that precharges each sense amplifier in each SA row with a sense amplifier reset signal (denoted as SARST_1, . . . , SARST_(N/2) in each row). Each SACTRL circuit also includes a dummy sense amplifier (DMY_SA) 16(1) to 16(N/2) that imitates the behavior of the sense amplifier sitting in the local IOs (e.g., SA 106(1) to SA 106(M) and SA 106(NI/2)(1) to SA 106(N/2)(M)). Each SACTRL circuit also includes a sense amplifier to output generator circuit (SAOEG) that provides sense amplifier enable signal SOE_1 to SOE_(N/2). For example, SACTRL_1 108(1) includes SAPRCH 12(1), SAOEG 14(1) and DMY_SA 16(1); SMPCTRL_(N/2) 108(N/2) includes SAPRCH 12(N/2), SAOEG 14(N/2) and DMY_SA 16(N/2). SAPRCH 12(1), . . . , 12(N/2), SOEG 14(1), . . . , SOEG 14(N/2). The DMY_SA has a dummy sense amplifier enable signal (SOE_RETURN_(N/2)) that travels half way back to DMY_SA. Here, the half way back means that a branch of the original sense amplifier signal SOE_(N/2) returns from the half of the number of the sense amplifiers, i.e. from 106(N/2)(M/2) as the dummy sense amplifier enable signal (SOE_RETURN_(N/2)).

GIO block 110 includes GIO 110(1), 110(2), . . . , 110(M−1) and 110(M). Each GIO for each bit of the N banks is coupled to each column of the SA array for each corresponding bit. For example, GIO 1101 is coupled to SA 10611, . . . , 106(N/2)1; GIO 1102 is coupled to SA 10612, . . . , 106(N/2)2; . . . ; GIO 110(M−1) is coupled to SENAMP 1061(M−1), . . . , 106(N/2)(M−1); GIO 110M is coupled to SENAMP 1061M, . . . , 106(N/2)M. GIO 1101, 1102, . . . , 110(M−1) and 110M is implemented in any of the conventional or prospective ways.

Figure 2:
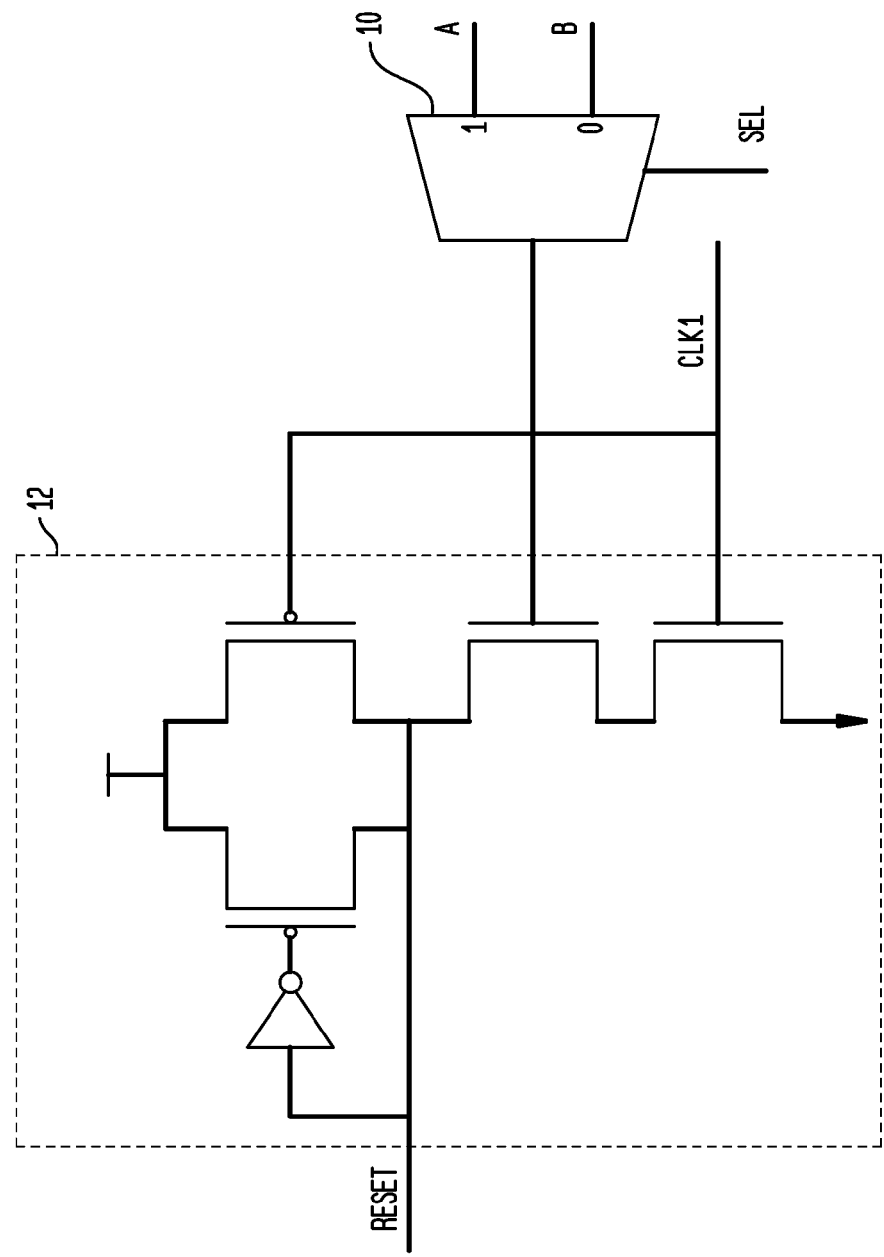
FIG. 2 shows a schematic view of an exemplary SRG 112 shown in FIG. 1.

FIG. 2 shows a schematic view of an exemplary SRG 112 shown in FIG. 1. SRG 112 selects a data set that is HIGH (e.g., "1" state) and generates a reset signal to reset the SA control circuits. SRG 112 includes multiplexer (MUX) 10 and latch 12. SRG 112 has a clock node (CLK1) receiving an internal clock (INTERNAL_CLK) signal, two input nodes, A and B, receiving data sets such as DATA_0 and DATA_1, a selection line (SEL) selecting a data set from DATA_0 and DATA_1, a reset node (RESET) that resets SACTRL circuits 108(1), . . . , 108(N/2) simultaneously. SRG 112 ensures either one of the two input nodes A and B goes HIGH in a read cycle, and then the SEL selects whichever is HIGH out of the two input nodes, A and B.

Figure 3:
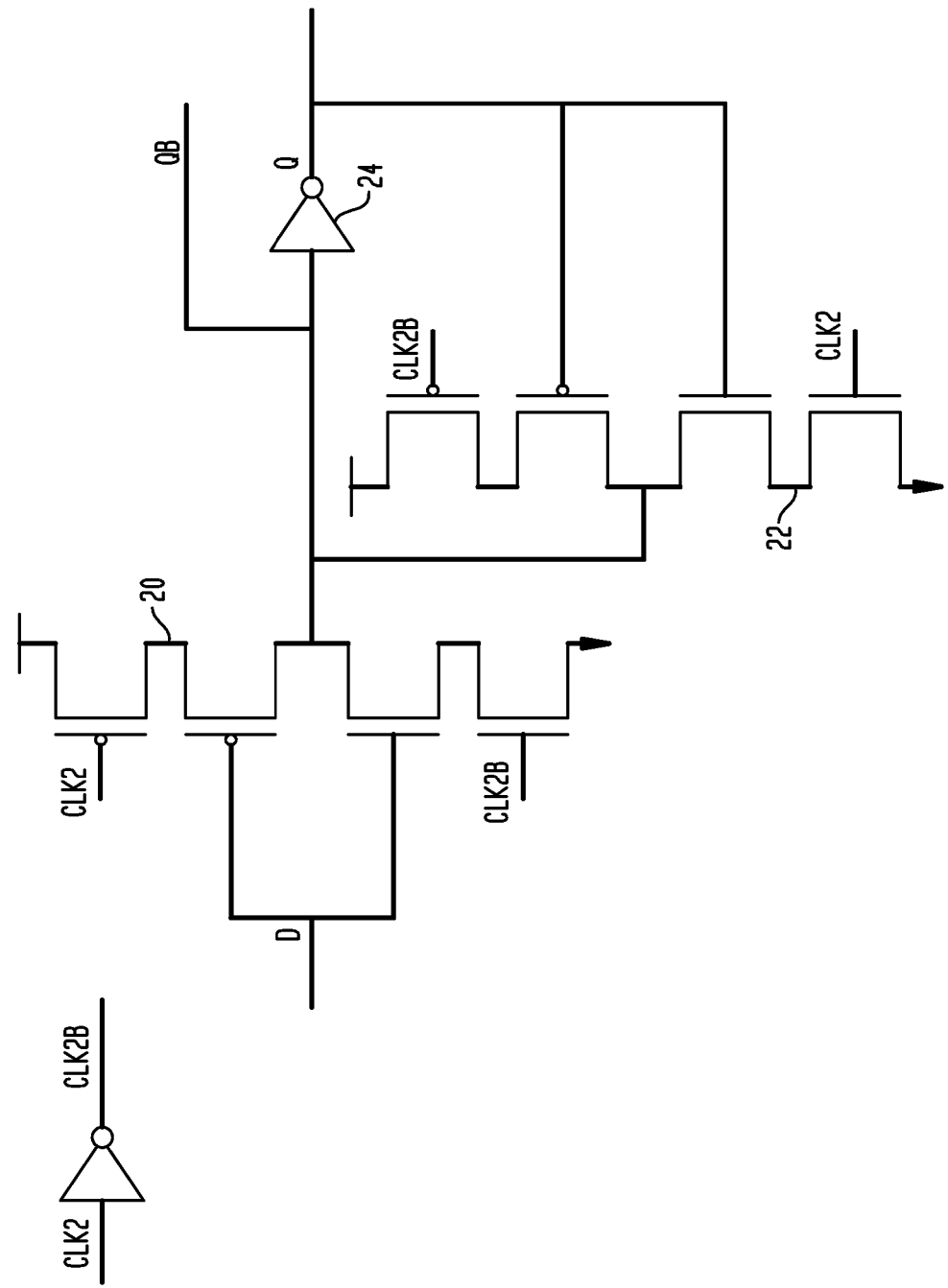
FIG. 3 shows a schematic view of an exemplary CFL 114 shown in FIG. 1.

CFL 114 is a clock controlled latch. FIG. 3 shows a schematic view of an exemplary CFL 114 shown in FIG. 1. As shown, CFL 114 includes two tristate inverters 20 and 22 and inverter 24. The input of inverter 24 is coupled to the outputs of tristate inverters 20, 22 and the output of inverter 24 is used as the input of tristate inverter 22. CFL 114 also has clock nodes (CLK2, CLK2B) that receive the INTERNAL_CLK and an inverted INTERNAL_CLK, respectively, an input node D that stores a previous state of the input D, and two output nodes Q and QB. When the CLK2 is LOW (e.g., "0" state), the CLK2B goes HIGH. An upper PMOS in tristate inverter 20 connected to the input node D then goes LOW. i.e. this PMOS is ON and a lower NMOS in tristate inverter 20 connected to the input node D goes HIGH, i.e. this NMOS is also ON. Thus, tristate inverter 20 works as an inverter, which is followed by another inverter (i.e., tristate inverter 22) whose output is the output Q. In this case, the state of the input node D is reflected on the output Q. Thus, the input node D to the output Q path is transparent. When the CLK2 is HIGH, both the upper PMOS and the lower NMOS in tristate inverter 20 that connect to the input node D is OFF, but an upper PMOS and a lower NMOS in tristate inverter 22 are ON and latch a state of the output Q. Thus, when the CLK2 is HIGH, tristate inverters 20, 22 controlled by CLK2 and CLK2B make CFL 114 latch a state of the output Q, which is the state of the input D. The output Q is an inverted output of the QB. Here, the CLK2B is an inverted signal of the CLK2, as shown in FIG. 3. More specifically, when the CLK2 is LOW, the output Q will change with the input D. When the CLK2 is HIGH, the previous state of the input D will be latched, the output Q will not change with the input D.

Returning to FIG. 1, in one exemplary embodiment, the DATA_0 is HIGH in one read cycle, the SEL in SRG 112 selects the DATA_0 and the DATA_0 is input into the D node of CFL 114. The outputs of CFL 114 are LATCH_OP_C and LATCH_OP_T that are sent into PSB 116.

Figure 4:
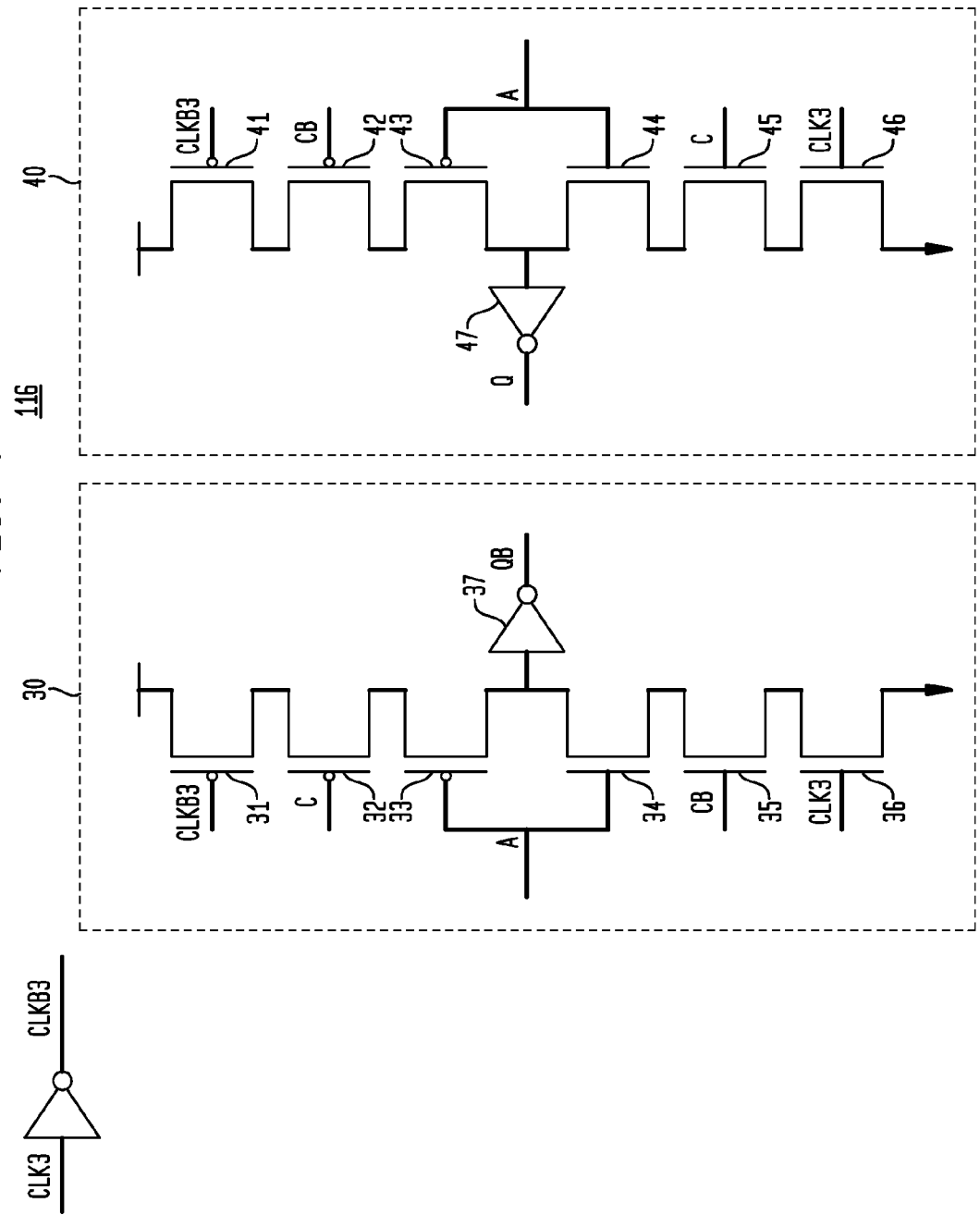
FIG. 4 shows a schematic view of an exemplary PDS 116 shown in FIG. 1.

FIG. 4 shows a schematic view of an exemplary PSB 116 shown in FIG. 1. PSB 116 includes circuits 30, 40 that each include six transistors (e.g., PMOSs 31, 32, 33, NMOSs 34, 35, 36, or PMOSs 41, 42, 43, NOMOSs 44, 45, 46) connected in series and two inverters 37, 47 each at the corresponding output node of circuits 30, 40. The first three transistors of circuits 30, 40 are three PMOSs forming a tristate inverter. The other three are three NMOSs forming another tristate inverter. The difference between circuits 30, 40 are the gates of the middle transistors among the three same transistors that have cross coupled inputs. For example, the gate of PMOS 32 and the gate of NMOS 45 have the same inputs C; the gate of NMOS 35 and the gate of PMOS 42 have the same inputs CB. This results in inverted outputs QB, Q of circuits 30, 40.

Furthermore, PSB 116 includes the same clock input signals CLK3 at the gates of PMOS 31, NMOS 36, the same clock inputs CLKB3 at PMOS 41 and NMOS 46, and the same data inputs A at PMOS 33, NMOS 34, PMOS 43 and NMOS 44. Thus, when CLK3 is HIGH, PSB 116 outputs the Q or QB nodes based on the state of the C and CB nodes. As shown in FIG. 1, in one exemplary embodiment, the C and CB nodes receive the LATCH_OP_T and LATCH_OP_C from CFL 114, respectively. Since DATA_0 is HIGH, the Q of PSB 116 outputs the DATA_0 and the QB output the DATA_1 that is inverted from DATA_0. The other nodes Q/QB is driven by DOL 118. The DUMMY_GRDL signal from DMY_SA 161, . . . 16(N/2) is sent to the input A of PSB 116. The SOE_RETURN_N trigger DMY_SAs 161, . . . , 16(N/2), respectively. By triggering DMY_SAs, PSB 116 pull dummy global read line (DUMMY GRDL) to LOW.

Figure 5:
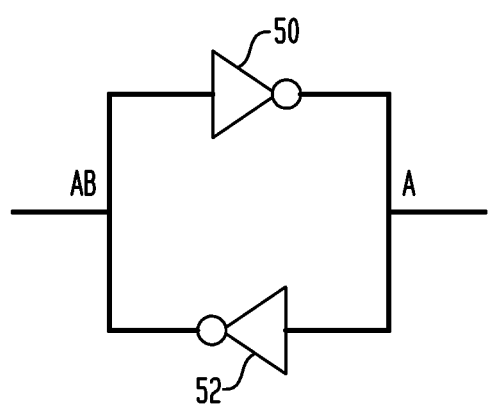
FIG. 5 shows a schematic view of an exemplary DOL 118 shown in FIG. 1.

FIG. 5 shows a schematic view of an exemplary DOL 118 shown in FIG. 1. DOL 118 is a latch formed by two cross-coupled inverters 50 and 52 and has two nodes, AB and A. The same latch is placed at the output of the sense amplifier of each local IO. In described embodiments, one of the two nodes, A and AB, is driven to "0" (i.e., ground) by PSB 116 and the other node is driven by the other one of the cross-coupled inverters 50 or 52.

Referring to FIG. 4 and FIG. 5, since the two tristate inverters in PSB 116 are controlled by the C and CB nodes, on the basis of the state of the C and CB, one of the Q/QB nodes is driven by A node. The cross coupled inverters of DOL 118 has one node either A or AB that is driven by PSB 116, and the other one is driven by itself. For example, if the C node is '0' and the CB node is '1', the A node of PSB 116 drives the QB node instead of the Q node. The QB node driven by PSB 116 then drives the AB node of DOL 118, and DOL 118 then drives the A node.

Herein, the INTERNAL_CLK is split into three portions each received by SRG 112, CFL 114 and PSB 116, respectively.

FIG. 6 shows an exemplary timing diagram of the sense amplifier for output tracking shown in FIG. 1. As shown, arrows with numeral labels represent events happened during a read cycle. Here, SOE_N represents any one of sense amplifier enable signal along with the corresponding row of sense amplifiers; SOE_RETURN_N represents any one of dummy sense amplifier enable signal along with the corresponding row of dummy sense amplifiers. In one exemplary embodiment, an initial state of DOL 118 is as follows: DATA_0 is '1' and DATA_1 is '0', then during a LOW period of an INTERNAL . . . CLK, CFL 114 is transparent and the LATCH_OP_C is '1' and the LATCH_OP_T is '0'. In event 202, when the INTERNAL_CLK goes HIGH, the SOE_N goes HIGH and triggers all the sense amplifiers sitting in the local IOs between two banks. In event 204, the SOE_RETURN_N also goes HIGH and comes back after travelling a half way, thereby horizontally tracking the SOE_N. A loading of the SOE_RETURN_N is kept the same as that of a normal sense amplifier such as SA TOP I and SA TOP M. In event 206, the SOE_RETURN_N triggers DMY_SAs 161, . . . 16(N/2), respectively, which pulls the dummy global read line (DUMMY GRDL) to LOW. During a HIGH period of the INTERNAL_CLK, PSB 116 drives DATA_0 or DATA_1 as per the state of the LATCH_OP_C and LATCH_OP_T. In one read cycle, the DATA_0 is driven by PSB 116 to LOW (in event 208), and the DATA_1 is driven by the one leg of the cross-coupled inverters 50 or 52 sitting in DOL 118 to HIGH (in event 210). In event 212, the transition of the DATA_1 to HIGH drives the output of MUX 10 of SRG 112 to HIGH, resulting in the RESET_SENSEAMP signal in SRG 112 LOW. Subsequently, in event 214, the RESET_SENSEAMP signal triggers the precharging of the DUMMY_GRDL, reset the INTERNAL_CLK, SOE_N and SOE_RETURN_N. Once the INTERNAL_CLK is LOW, in event 216, CFL 114 is transparent that updates the state of the LATCH_OP_C and LATCH_OP_T as per new states of the DATA_0 and DATA_1. Here, the read cycle is completed and a new internal clock is generated for operations in a subsequent read cycle.

FIG. 7 shows a flowchart showing a method for a sense amplifier for output tracking in accordance with exemplary embodiments. Referring to FIG. 1, at step 302, an internal clock signal (INTERNAL_CLK) in a state of HIGH is input into SRAM system 100 to trigger sense amplifiers and dummy sense amplifiers in a read cycle. At step 304, dummy sense amplifier enable signals (SOE_RETURN_N) travel horizontally a half way back to track sense amplifier enable signals (SOE_N). At step 306, by triggering the dummy sense amplifiers, PSB 116 pulls dummy global readlines (DUMMY_GRDL) to LOW (e.g., "0" state). At step 308, PSB 116 drives selected data (e.g., DATA_1) selected by SRG 112 LOW and sends it to CFL 114. PSB 116 also drives non-selected data (DATA_0) HIGH. This results in a sense amplifier reset signal (RESET_SENSEAMP) LOW. The RESET_SENSEAMP triggers precharge of the DUMMY . . . GRDL and resets the INTERNAL_CLK, SOE_N and SOE_RETURN_N (at step 310). At step 312, once the INTERNAL_CLK is reset to LOW, CFL 114 is transparent; the state of the outputs of CFL 114 is updated based on new states of DATA_0 and DATA_1, and the RESET_SENSEAMP signal resets to HIGH. Then the read cycle ends and a new read cycle starts when the INTERNAL_CLK signal goes HIGH.

A sense amplifier for output tracking by a controlled feedback latch in a memory has the following advantages. First, this tracking method has no requirement to restore a DOL latch. In conventional methods of the sense amplifier to output tracking, restoring the DOL latch is time consuming that result in a penalty of a cycle time. Thus, the tracking method disclosed in the described embodiments provide a short cycle time over the conventional methods. Next, the DOL latch used in the described embodiment is the same as the latch used in the output of a sense amplifier of each local IO, which mimic the behavior of the latch in the output of the sense amplifier and provide desired tracking of read data latched in the DOL. The third, since a sense amplifier reset (RESET_SENSEAMP) signal is initiated by the data latched in the DOL, there is no margin involved between the reset of the sense amplifier and the read data latched at outputs, as such, the described embodiment provide a margin free global self-time sense amplifier reset technique.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs.

Rather, use of the word exemplary is intended to present concepts in a concrete fashion. Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Although the subject matter described herein is described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the embodiments are not so limited. As would be apparent to one skilled in the art, various functions of circuit elements also is implemented as processing blocks in a software program. Such software is employed in, for example, a digital signal processor, micro-controller, or general purpose computer.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps are included in such methods, and certain steps are omitted or combined, in methods consistent with various embodiments.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground is considered a power source having a voltage of approximately zero volts, and a power source having any desired voltage is substituted for ground. Therefore, all gates are powered by at least two power sources, with the attendant digital signals therefrom having voltages that range between the approximate voltages of the power sources.

Signals and corresponding nodes or ports is referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and consist of multiple transistors coupled in parallel to get desired electrical characteristics from the combination. Further, the illustrated transistors are composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the embodiment is implemented using bi-polar transistor technology.

No claim element herein is to be construed under the provisions of 35 U.S.C. §112, sixth paragraph, unless the element is expressly recited using the phrase "means for" or "step for."

It will be further understood that various changes in the details, materials, and arrangements of the parts which have been described and illustrated in order to explain the nature of described embodiments is made by those skilled in the art without departing from the scope as expressed in the following claims.

We claim:
1. A memory circuit, comprising:
a static random access memory (SRAM) including N banks of memory cells, each bank having M columns of the SRAM, where M and N are positive integers;
rows of M sense amplifiers, each row of the M sense amplifiers placed between two banks of the memory cells and having a sense amplifier control circuit and a local input/output circuit wherein each sense amplifier control circuit includes a dummy sense amplifier that imitates the behavior of the M sense amplifiers;
a controlled feedback latch storing a previous state of input data in a read cycle;
a pull down select block coupled to the controlled feedback latch and the dummy sense amplifier, wherein the pull down select block pulls dummy global read lines of the dummy sense amplifier to LOW, outputs read data depending on the state of outputs of the controlled feedback latch;
a dummy output latch coupled to the pull-down select block to store the read data; and
a SRAM reset generation circuit coupled to the sense amplifier control circuits and the controlled feedback latch, the SRAM reset generation circuit selecting the input data that is HIGH for the controlled feedback latch and generating a sense amplifier reset signal to reset the sense amplifier control circuits, wherein the dummy output latch is a latch that is the same as a sense amplifier latch used in the local input/output circuit, thereby, no margin is involved between a reset of the sense amplifiers and the read data latched at the dummy output latch in the read cycle.

2. The memory circuit of claim 1, further comprising a global input/output circuit (GIO) that includes M GIO elements, each GIO element coupled to each corresponding column of the SRAM.

3. The memory circuit of claim 2, wherein each column of the M sense amplifiers connected together and coupled to the corresponding GIO element of the corresponding column.

4. The memory circuit of claim 1, wherein each sense amplifier corresponding to a bit of the memory cell, the bit having corresponding global read lines.

5. The memory circuit of claim 1, wherein each sense amplifier control circuit includes a sense amplifier precharge circuit for precharging the sense amplifier and a sense amplifier to output enable generator for providing a sense amplifier enable signal for the sense amplifiers.

6. The memory circuit of claim 5, wherein the sense amplifier reset signal is sent into the sense amplifier precharge circuit and the sense amplifier to output enable generator to reset the sense amplifier control circuits.

7. The memory circuit of claim 1, wherein dummy sense amplifier enable signals travel a half way back to horizontally track sense amplifier enable signals.

8. The memory circuit of claim 1, wherein an internal clock signal is input into the SRAM reset generation circuit, the controlled feedback latch, and the pull-down select block to trigger the sense amplifier and the dummy sense amplifier.

9. The memory circuit of claim 8, wherein a data path in the controlled feedback latch is transparent when the internal clock signal is LOW (e.g., "0" state).

10. The memory circuit of claim 8, wherein the controlled feedback latch latches a state of an controlled feedback output, which is the state of an controlled feedback input, when the clock signal is HIGH (e.g., "1" state).

11. The memory circuit of claim 1, wherein the controlled feedback latch includes two tristate inverters and an inverter coupled to the two tristate inverters.

12. The memory circuit of claim 1, wherein the dummy output latch includes two cross-coupled inverters.

13. The memory circuit of claim 1, wherein the SRAM reset generation circuit includes a multiplexer and a reset latch.

14. The memory circuit of claim 1, wherein the pull-down select block includes two circuits each having six transistors connected in series.

15. The memory circuit of claim 14, wherein first three transistors are PMOS transistors and the other three are NMOS transistors, and the middle transistors among the first three PMOS transistors and the other three NMOS transistors have cross coupled pull-down select inputs.

16. A method for a sense amplifier to output tracking in a static random access memory (SRAM) system, the method comprising the steps of:
   inputting an internal clock signal to trigger sense amplifiers and dummy sense amplifier in a read cycle;
   horizontally tracking sense amplifier enable signals with dummy sense amplifier enable signals travelling a half way back;
   pulling dummy global read lines to LOW by triggering dummy sense amplifiers;
   driving selected data to LOW and non-selected data to HIGH that results in a sense amplifier reset signal LOW;
   using the sense amplifier reset signal to trigger precharging of the dummy global read lines and reset the internal clock, sense amplifier enable signal and dummy sense amplifier enable signal; and
   updating the state of the selected data and the non-selected data once the internal clock is LOW, and completing the read cycle.

* * * * *